United States Patent [19]

Hara et al.

[11] Patent Number: 5,293,055
[45] Date of Patent: Mar. 8, 1994

[54] SEMICONDUCTOR INTEGRATED CIRCUIT DEVICE

[75] Inventors: Takahiko Hara; Syuso Fujii, both of Kawasaki, Japan

[73] Assignee: Kabushiki Kaisha Toshiba, Kawasaki, Japan

[21] Appl. No.: 889,635

[22] Filed: May 28, 1992

[30] Foreign Application Priority Data

May 28, 1991 [JP] Japan .................. 3-123936

[51] Int. Cl.$^5$ .............................. H01L 29/68
[52] U.S. Cl. ....................... 257/296; 257/301; 257/304; 257/371; 257/393; 257/503; 257/532
[58] Field of Search ............... 257/296, 301, 304, 371, 257/393, 503, 532

[56] References Cited

U.S. PATENT DOCUMENTS 4,571,505 2/1986 Eaton, Jr. .
5,079,613 1/1992 Sawada et al. ............... 257/296

FOREIGN PATENT DOCUMENTS 8714849 2/1988 Fed. Rep. of Germany .
3806951 9/1988 Fed. Rep. of Germany .
3936675 6/1990 Fed. Rep. of Germany .

Primary Examiner—Edward Wojciechowicz
Attorney, Agent, or Firm—Oblon, Spivak, McClelland, Maier & Neustadt

[57] ABSTRACT

In a CMOS-DRAM, an n-type silicon substrate has a p-type well formed therein, and a DRAM cell array is formed in the p-type well. In a period immediately after an external power supply is turned on, the p-type well is in a substantially floated condition. A predetermined time after the external power supply is turned on, the p-type well is applied with a predetermined DC voltage generated by a well voltage generating circuit. The CMOS-DRAM has a selective grounding circuit. When the external power supply is turned on, the selective grounding circuit forcibly grounds the plate electrode of the DRAM cell array for a predetermined period of time. Therefore, an increase in the well voltage at the cell array region, which increase may occur due to the capacitive coupling, is prevented when the power supply is turned on. Accordingly, adverse effects arising from the increase in the well voltage are prevented.

19 Claims, 12 Drawing Sheets

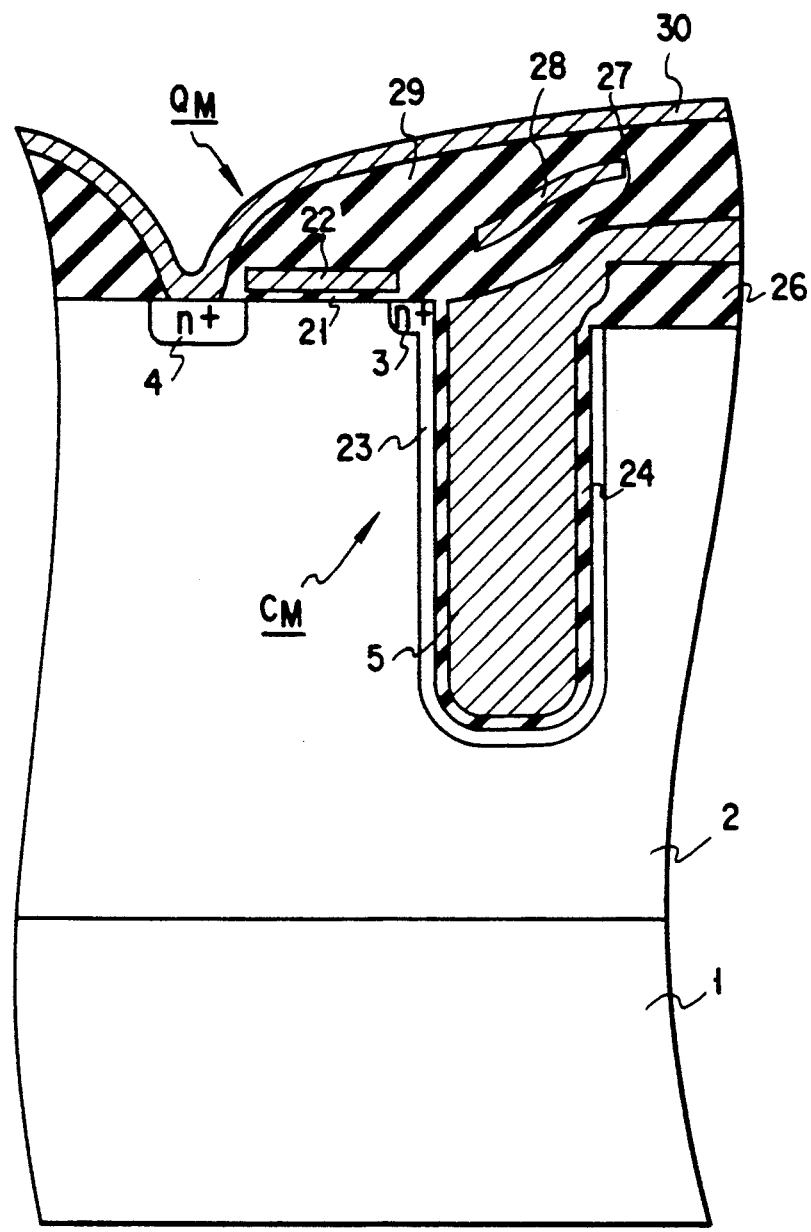
F I G. 2

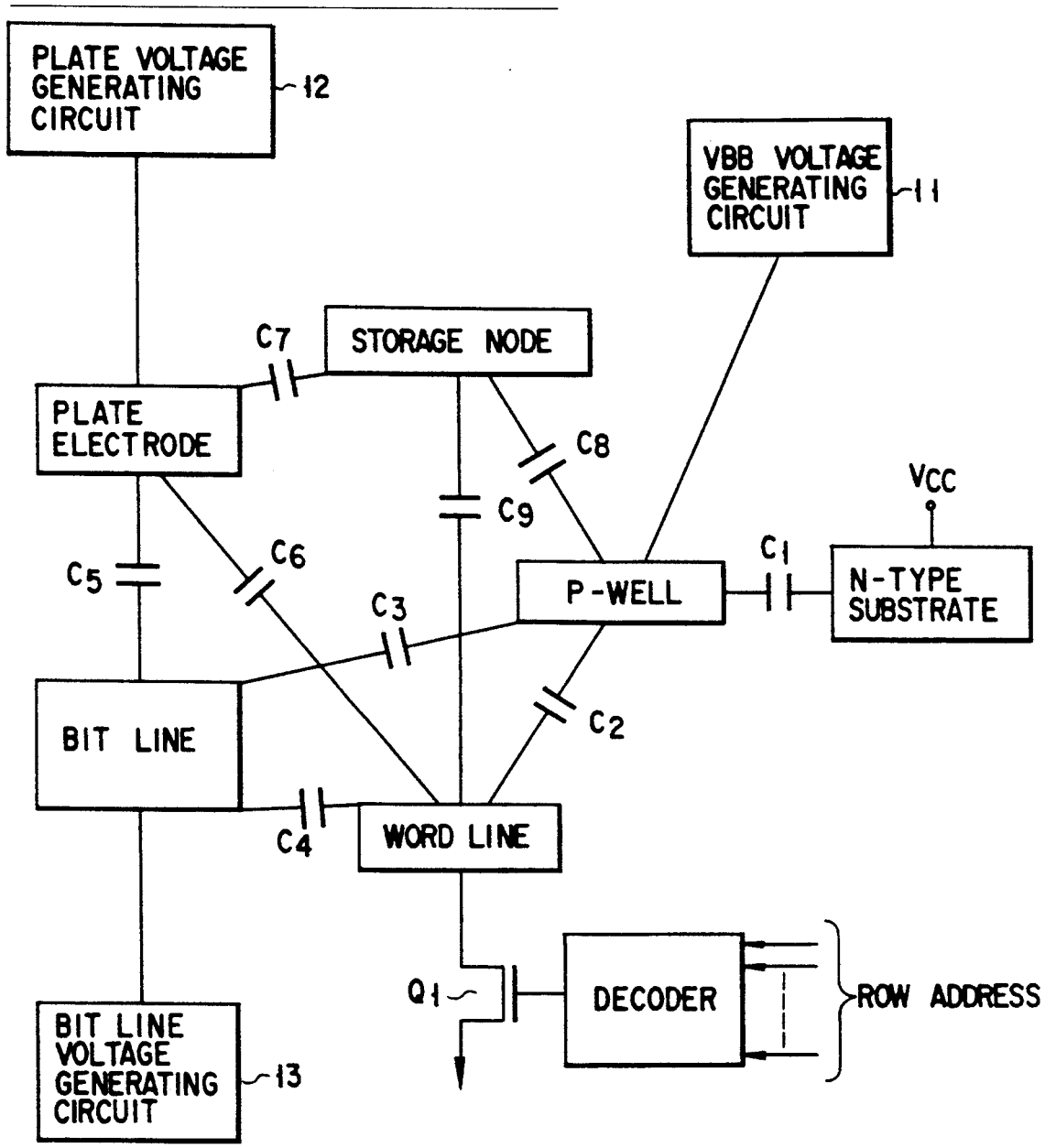
F I G. 3

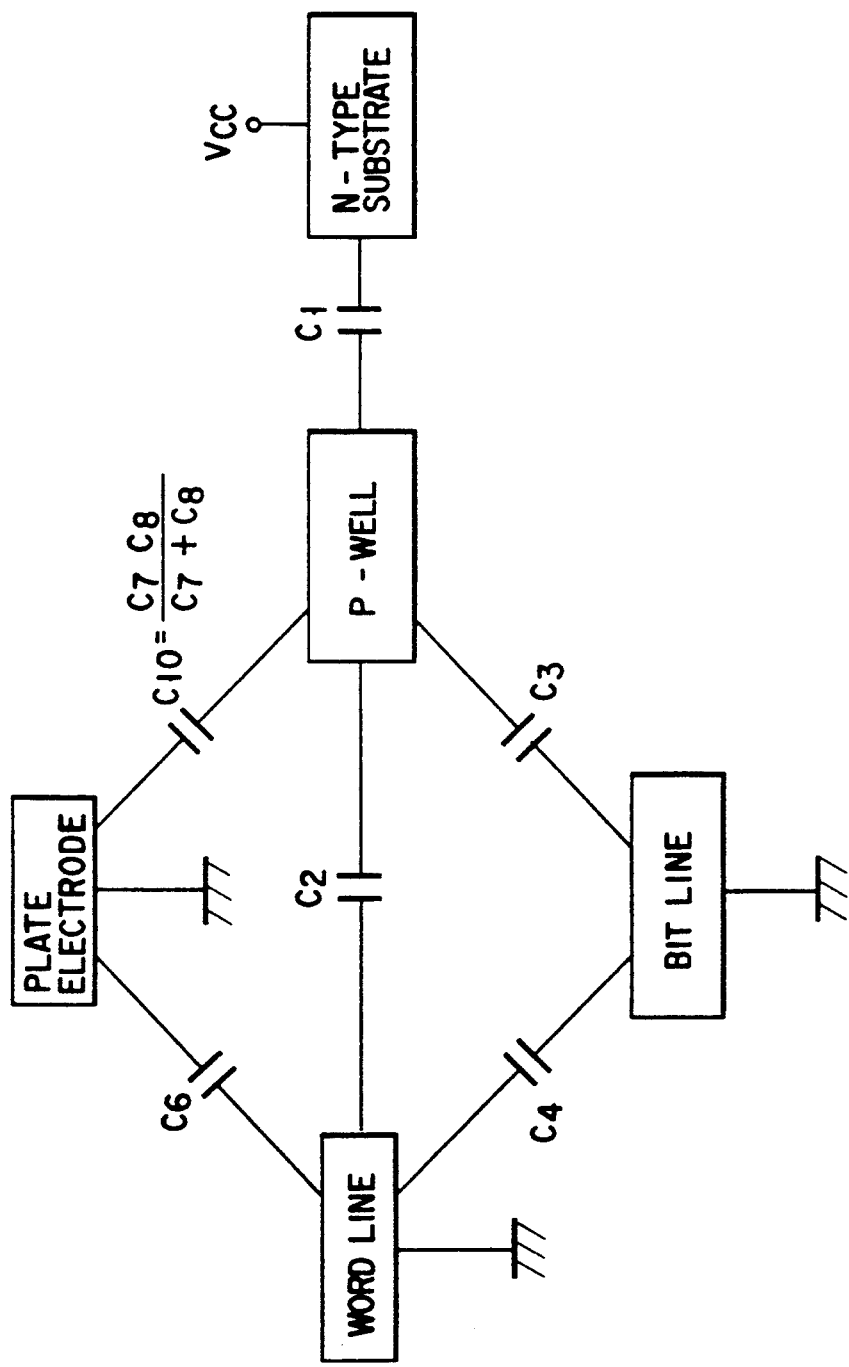
F I G. 4

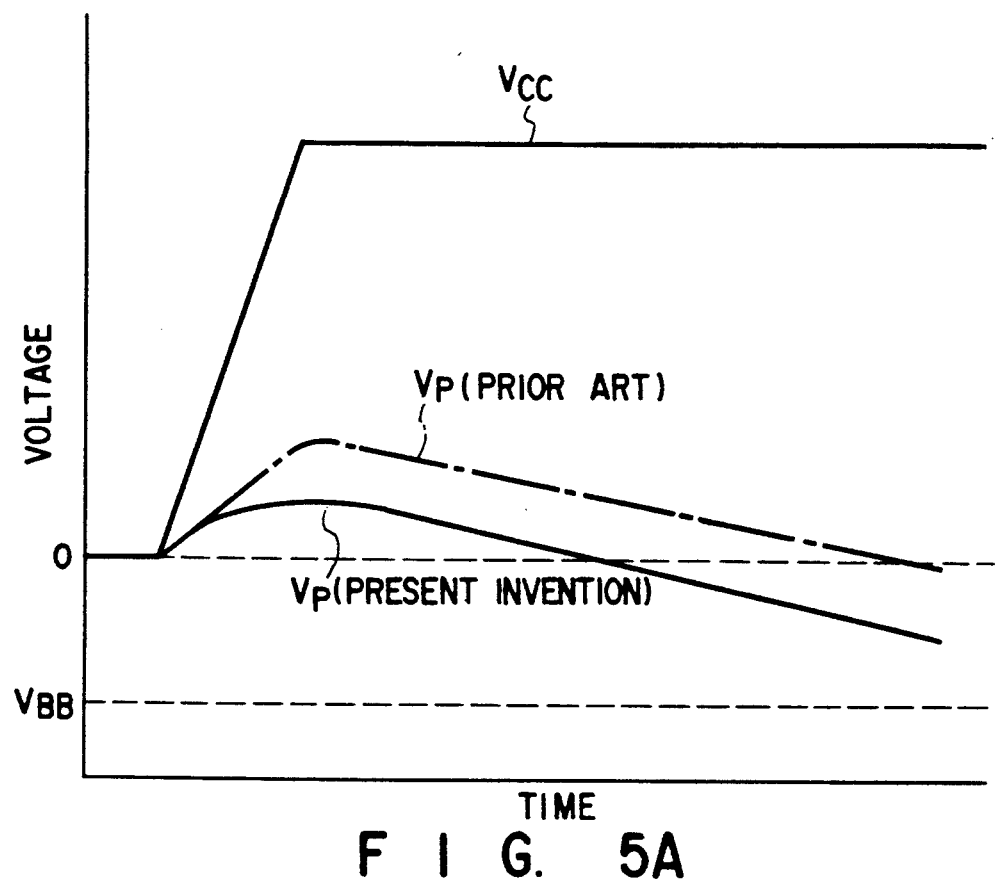
F I G. 5A
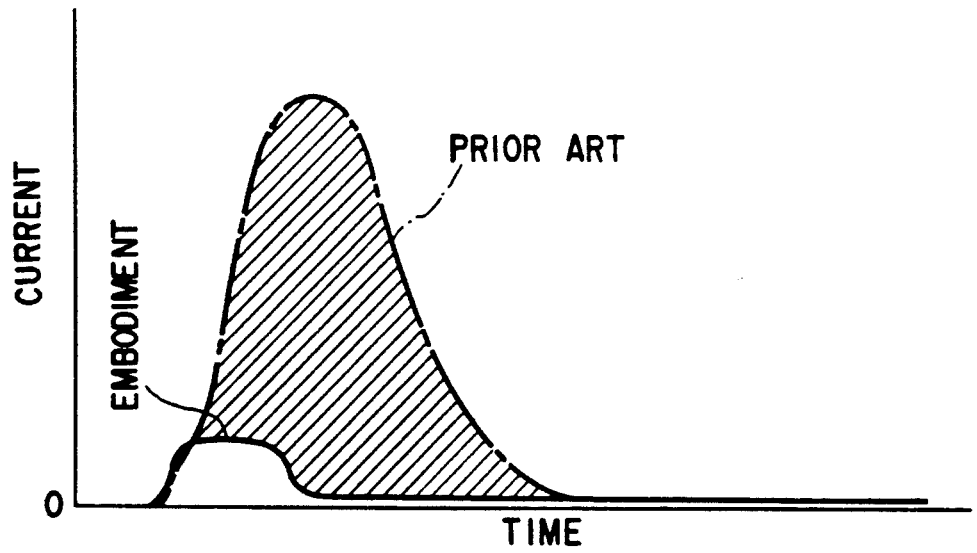
F I G. 5B

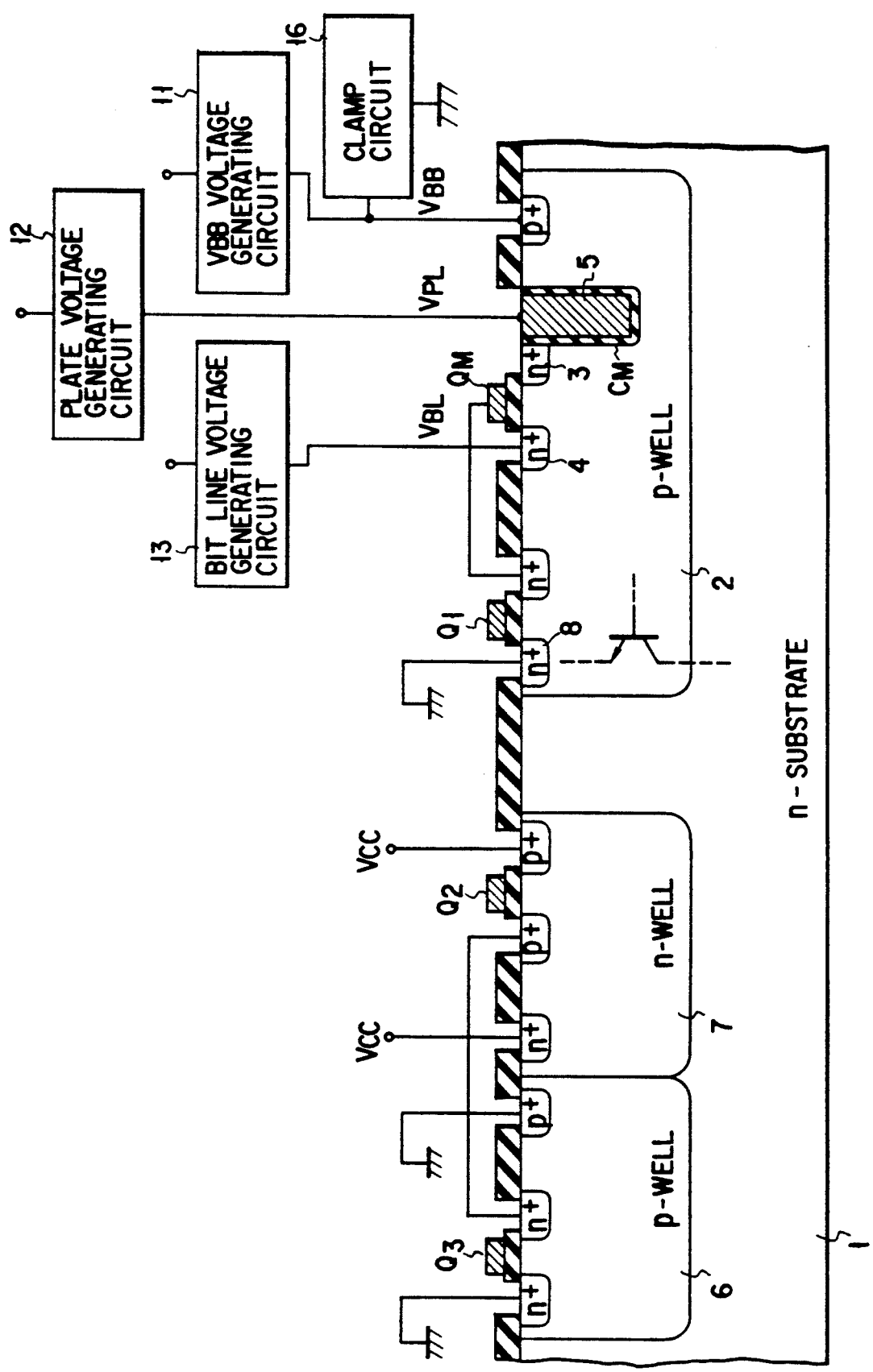
F I G. 6

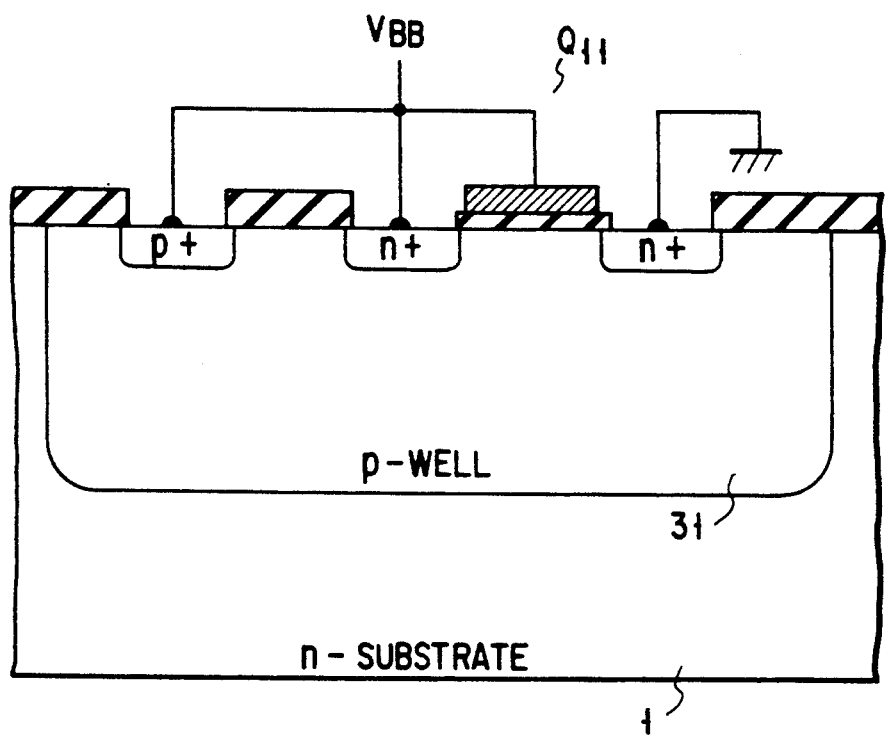
F I G. 8

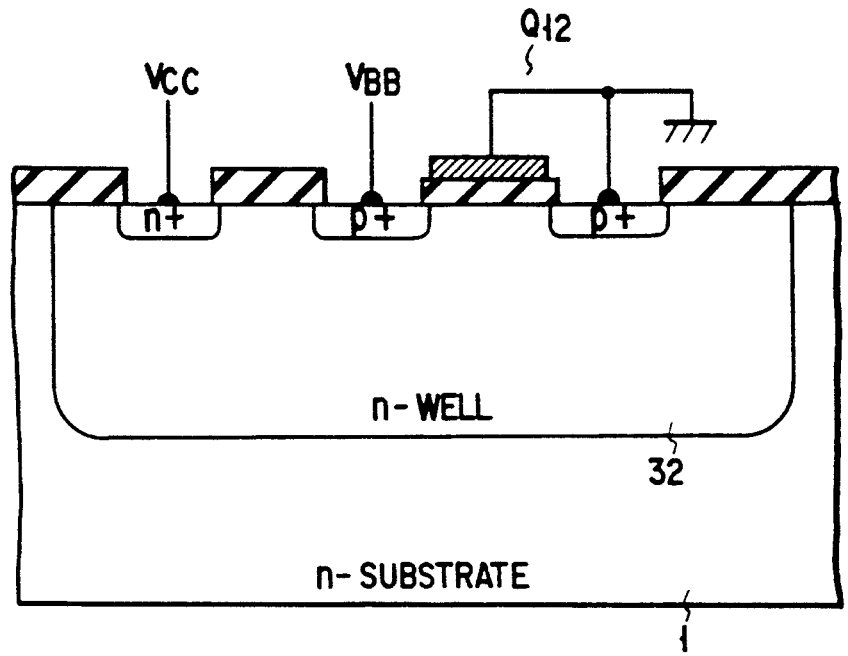
F I G. 9
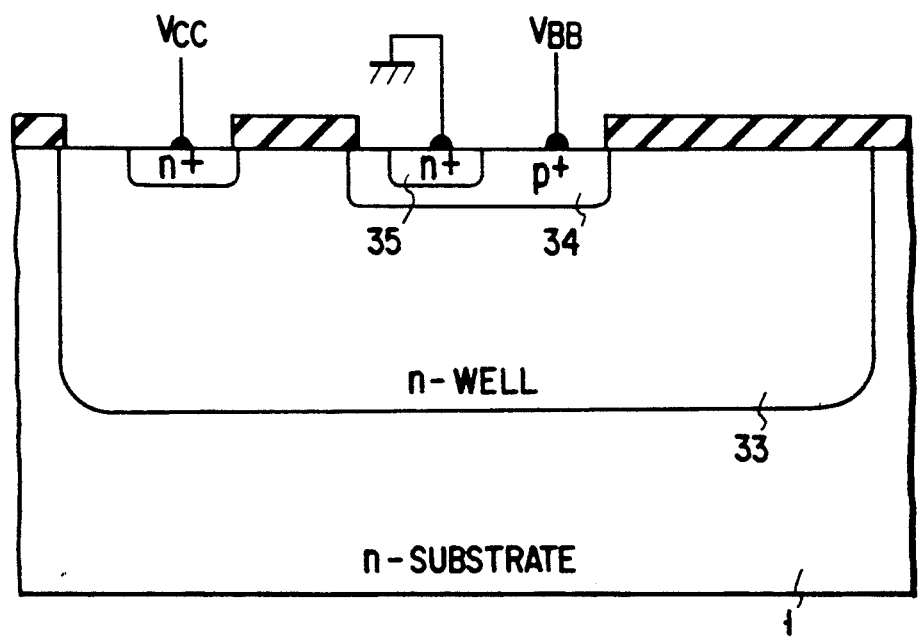
F I G. 10

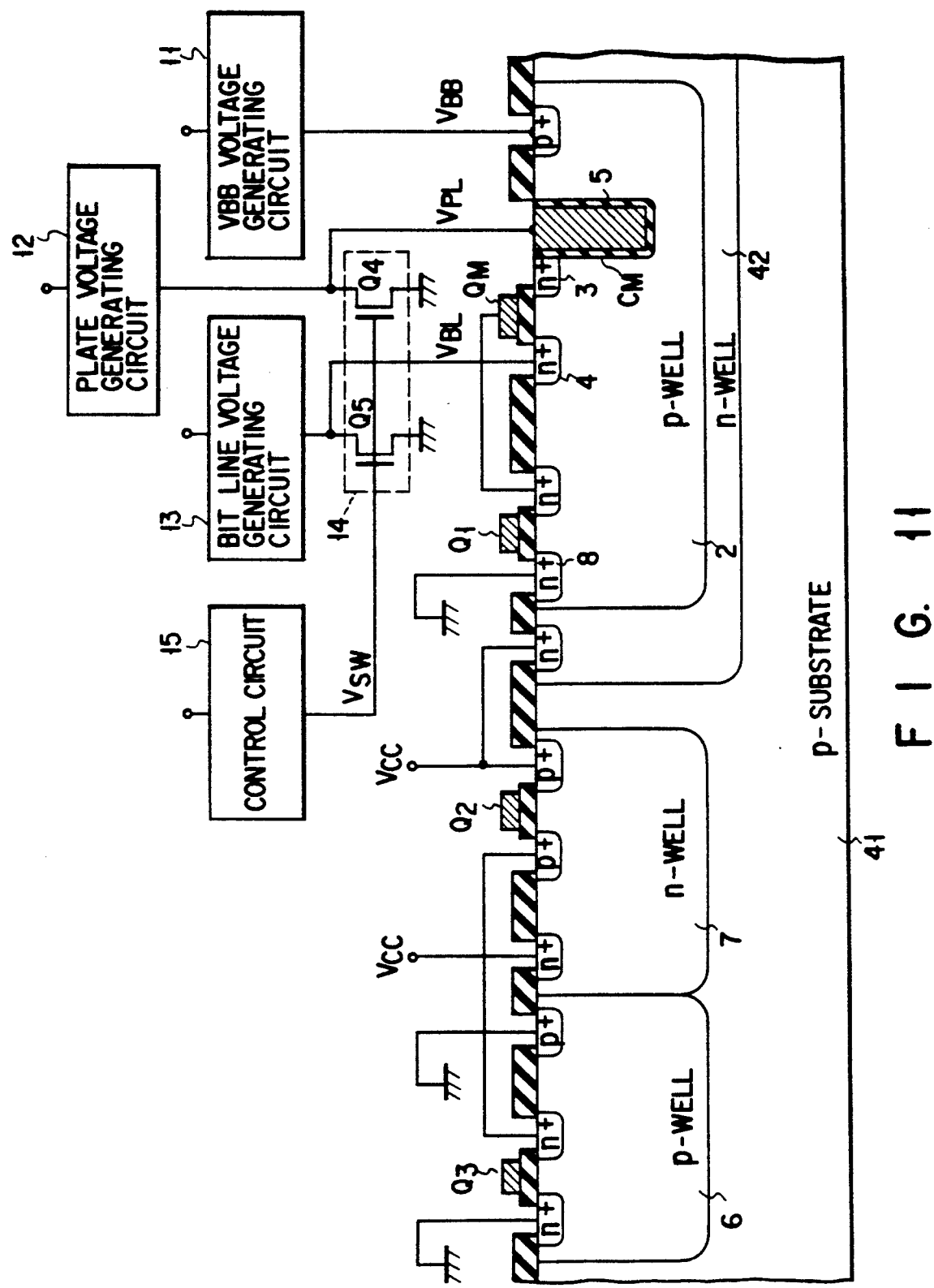
F I G. 11

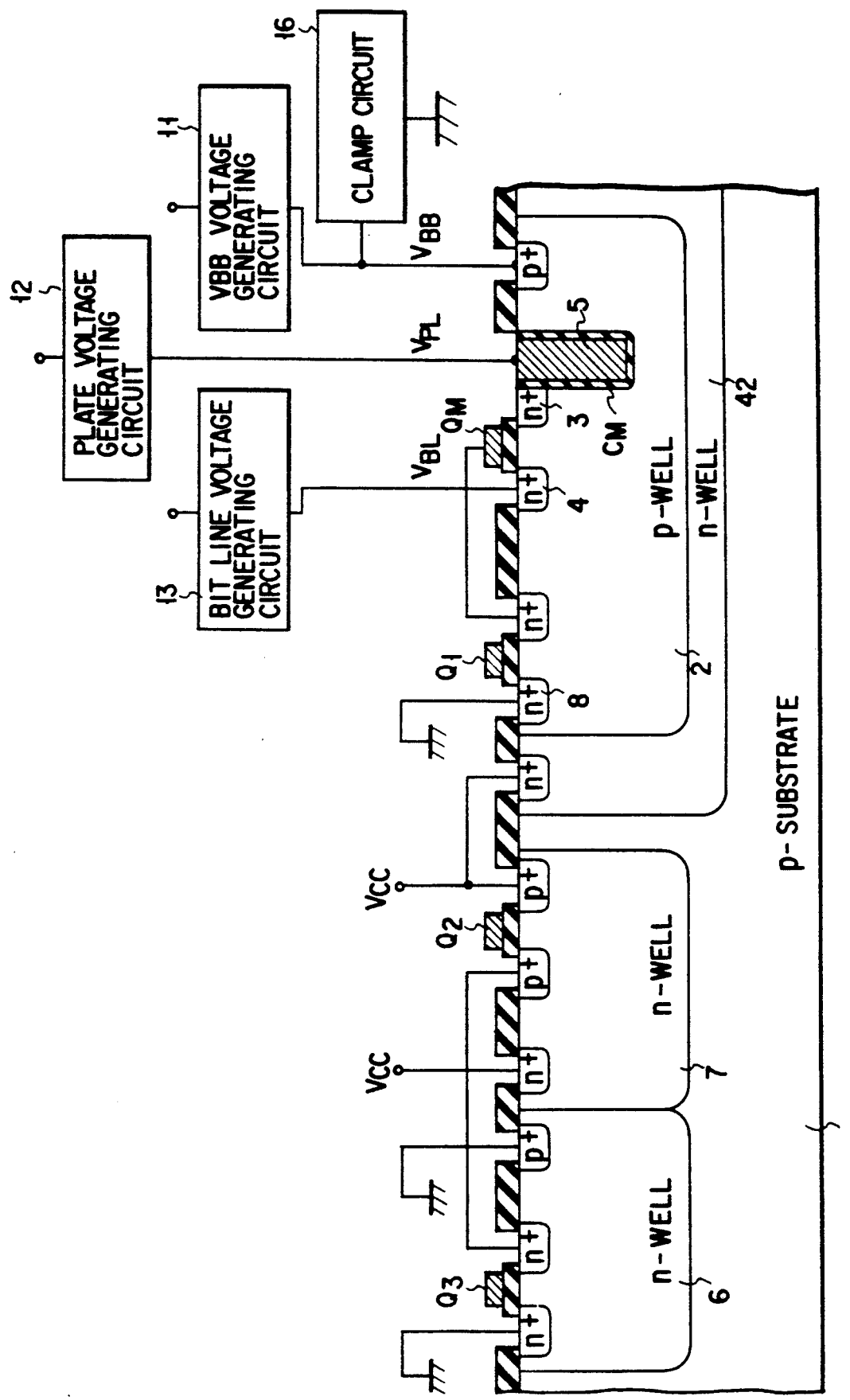
F I G. 12

SEMICONDUCTOR INTEGRATED CIRCUIT DEVICE

BACKGROUND OF THE INVENTION

1. Field of the Invention

The present invention relates to a semiconductor integrated circuit device, such as a dynamic random access memory (DRAM) of a CMOS type.

2. Description of the Related Art

In a CMOS integrated circuit, an NMOS transistor and a PMOS transistor are formed in an isolated manner by use of a wafer wherein a first-conductivity type semiconductor substrate has a second-conductivity type well formed therein A DRAM is one example of such a CMOS integrated circuit. Many of conventional CMOS-DRAMs employ a p-type silicon substrate. This is the DRAMs can be manufactured at low cost since the p-type silicon substrate is lower in price than the n-type silicon substrate.

In the case where an NMOS DRAM cell is fabricated by use of a p-type substrate, it is general that a negative substrate bias $V_{BB}$ (normally, $-2$ V or thereabouts) is applied to the p-type substrate because application of such the negative substrate bias not only reduces the bit line capacitance which is due to the reduction of a p-n junction capacitance but also improves the cut-off characteristic of a cell transistor. Therefore, the NMOS transistor is designed such that its threshold voltage takes an optimal value at the time of application of the substrate bias $V_{BB}$.

If the NMOS transistor is designed in this manner, the threshold voltage of the NMOS transistor is low immediately after the power supply is turned on since the substrate bias is 0 V at the time. It may therefore happen that the circuit cannot be initialized due to a large amount of penetration current flowing through peripheral circuits. This problem is serious if the MOS transistor is miniaturized since, in the case where the MOS transistor is miniaturized, the impurity concentration of the substrate portion corresponding to an NMOS transistor region has to be increased for suppressing the short channel effect and the substrate bias effect is inevitably increased thereby.

In recent years, n-type silicon substrates have come to be employed in more and more CMOS-DRAMs. The employment of the n-type silicon substrates is advantageous in the following points:

First, the data retaining characteristic of a DRAM cell can be improved. The reason for this improvement is that, where a DRAM cell array is provided in a p-type well formed in an n-type silicon substrate, the DRAM cell is protected by the pn junction formed between the n-type substrate and the p-type well. To be more specific, part of the electrons that are generated by the irradiation of c-rays are attracted toward the n-type substrate, not toward the DRAM cell, with the result that the soft error durability is improved. In addition, the damage to cell data due to the undershoot of input pins or due to the minority carriers generated from the n-channel MOS transistors of the peripheral circuits, can be prevented.

Second, the core circuit portion including the DRAM cell array and the p-type well of a peripheral circuit can be isolated from each other, and different bias voltages can be applied thereto. For example, the p-type well of the DRAM cell array region can be applied with a negative voltage $V_{BB}$, while the p-type well of the peripheral circuit portion can be set at the ground potential level. When the power supply is turned on, therefore, a large amount of penetration current is prevented from flowing through peripheral circuits, since the threshold voltage of the NMOS transistors of the DRAM cell array and that of the NMOS transistors of the peripheral circuit portion can be optimally determined in accordance with the bias voltages of their respective p-type wells.

However, in the case where the DRAM is fabricated by use of the n-type silicon substrate in the manner stated above, the voltage at the p-type well of the core circuit portion transiently increases when the power supply is turned on, due to the capacitive coupling between that p-type well and the substrate. Such a transient voltage increase at the p-type well gives rise to disadvantages to the characteristics of the DRAM. One of the disadvantages is: if the p-type well containing a DRAM cell array formed therein has grounded n-type diffusion layers, a large amount of penetration current inevitably flows, due to the existence of parasitic bipolar transistors. Another disadvantages is: if the p-type well does not have an n-type diffusion layer which is grounded, a long time is required for the DRAM to start a normal operation after the power supply is turned on. These two disadvantages will be explained in more detail, with reference to the drawings.

FIG. 13 is a sectional view showing the major portion of a DRAM chip that employs an n-type substrate 1. A p-type well 2 is formed in the cell array region of the n-type substrate 1, and memory cells each made up of an NMOS transistor QM and a capacitor CM are formed in the p-type well in an array. N-type diffusion layers 3 and 4, which serve as the source and drain of the NMOS transistor QM, respectively, are storage nodes and connected to a bit line. A trench is formed in the vicinity of the n-type diffusion layer 3, which is a storage node, and a plate electrode 5 is embedded in the trench, thereby forming a capacitor CM. An NMOS transistor Q1, with which to ground a word line nonselected, is normally formed in the p-type well 2 wherein the DRAM cell array is formed.

A p-type well 6 and an n-type well 7 are formed in the peripheral circuit region, so as to provide an NMOS circuit and a PMOS circuit. In FIG. 13, one NMOS transistor Q3 is depicted as being formed in the p-type well 6, and one PMOS transistor Q2 is depicted as being formed in the n-type well 7.

In an normal operation mode, the p-type well 2 of the DRAM cell array region is applied with a negative bias voltage $V_{BB}$ from a $V_{BB}$ voltage generating circuit 11. The plate electrode of the DRAM cell is applied with a bias voltage $V_{PL}$ from a plate voltage generating circuit 12, and the bit line is applied with a bias voltage $V_{BL}$ from a bit line voltage generating circuit 13 at the time of precharge. The p-type well 6 of the peripheral circuit portion is grounded, and the n-type well 7 thereof is connected to power supply $V_{CC}$.

In the circuit arrangement mentioned above, a parasitic npn transistor T is inevitably formed by an n-type diffusion layer 8 (which is connected to a ground potential point of the NMOS transistor Q1), the p-type well 2, and the n-type substrate 1. After the power supply $V_{CC}$ is turned on, the p-type well 2 of the core circuit portion is kept floated for a certain time until the $V_{BB}$ voltage generating circuit 11 begins to operate in a normal manner. Since, therefore, the voltage at the p-type well 2 is increased due to the capacitive coupling at the pn junction between the substrate 1 and the p-type well 2, the voltage becomes positive. Accordingly, when the parasitic transistor T becomes ON, a large amount of penetration current flows between $V_{CC}$ and $V_{SS}$.

The above-mentioned parasitic bipolar transistor is not formed in the case where the p-type well 2 does not contain a grounded n-type diffusion layer, such as the NMOS transistor Q1 provided for grounding the word line non-selected Even in this case, an increase in the voltage at the p-type well still produces a problem.

As long as there is a grounded n-type diffusion layer (even if this diffusion layer has a very small area in comparison with the area of the p-type well 2), an increase in the voltage at the p-type well is suppressed because a pn junction current flows out. In contrast, in the case where there is no grounded n-type diffusion layer, the pn junction current does not flow at all. Hence, a long time is required for the voltage at the p-type well 2 to reach the negative bias voltage $V_{BB}$ (i.e., the voltage value determined at the time of design), after the $V_{BB}$ voltage generating circuit begins to operate.

As mentioned above, in the conventional CMOS-DRAM employing an n-type substrate, the bias voltage generating circuit is connected to the p-type well where the DRAM cell array is formed. Since, in the CMOS-DRAM, the p-type well is kept floated for a certain period after the power supply is turned on, the voltage at the p-type well transiently increases. Due to this transient voltage increase, the parasitic bipolar transistor becomes ON, resulting in the flow of a large amount of penetration current Even if the parasitic bipolar transistor does not become ON, a long time is required before the CMOS-DRAM can operate in a normal manner (i.e., the delay time is lengthened).

The problems mentioned above are not peculiar to a DRAM; they may occur in circuits of other types, such as a CMOS circuit, as long as the circuits have a similar well structure to that of the above-mentioned DRAM.

SUMMARY OF THE INVENTION

Accordingly, an object of the present invention is to provide a semiconductor integrated circuit device which has solved the above-mentioned problems by suppressing a transient voltage increase that may occur in a transistor circuit-containing well when the power supply is turned on.

The present invention provides a semiconductor integrated circuit device comprising:
  a semiconductor substrate;
  a first conductivity type region formed in the substrate;
  a second conductivity type well surrounded by the first conductivity type region;
  a semiconductor circuit element formed in the second conductivity type well, the semiconductor circuit element having an electrode which is in capacitive coupling to the second conductivity type well;
  means for applying a first voltage to the semiconductor circuit element;
  means for applying a second voltage to the first conductivity type region; and
  a well voltage generating circuit, formed in the substrate, for applying a well voltage to the second conductivity type well.

According to one aspect of the present invention, the semiconductor integrated circuit device comprises means for forcibly maintaining the electrode at a ground potential level for a predetermined period of time.

According to another aspect of the present invention, the semiconductor integrated circuit device comprises clamp means, formed in the substrate, for preventing the second conductivity type well from being set in an opposite polarity to that of the potential determined by the well voltage.

The first conductivity and the second conductivity are preferably an n type and p type, respectively.

According to the present invention, a transient voltage increases, which may occur in the second conductivity type well containing a semiconductor circuit element, can be suppressed when the power supply is turned on. Even where a parasitic bipolar transistor is formed between the second conductivity type well an the first conductivity type substrate, the parasitic bipolar transistor is not turned on, and no penetration current flows in the transistor circuit region. Where such a bipolar transistor is not formed, it is possible to shorten the time required for the bias voltage at the second conductivity type well to reach a value predetermined at the time of design.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a view showing the DRAM cell structure of the first embodiment;

FIG. 3 is a diagram showing the state of the capacitive coupling between the structural elements of a DRAM cell array;

FIG. 4 is a simplified diagram of the diagram shown in FIG. 3;

FIGS. 5A and 5B are graphs for illustrating the operation of the first embodiment;

FIG. 6 is a view showing the major portion of a CMOS-DRAM according to the second embodiment of the present invention;

FIG. 8 is a view showing how the clamp circuit depicted in FIG. 7A is formed;

FIG. 9 is a view showing how the clamp circuit depicted in FIG. 7B is formed;

FIG. 10 is a view showing how the clamp circuit depicted in FIG. 7C is formed;

FIG. 11 is a view showing the major portion of a CMOS-DRAM according to the third embodiment of the present invention;

FIG. 12 is a view showing the major portion of a CMOS-DRAM according to the fourth embodiment of the present invention.

DETAILED DESCRIPTION OF THE PREFERRED EMBODIMENTS

Embodiments in which the present invention is applied to a CMOS-DRAM will now be described, with reference to the accompanying drawings.

Figure 1:
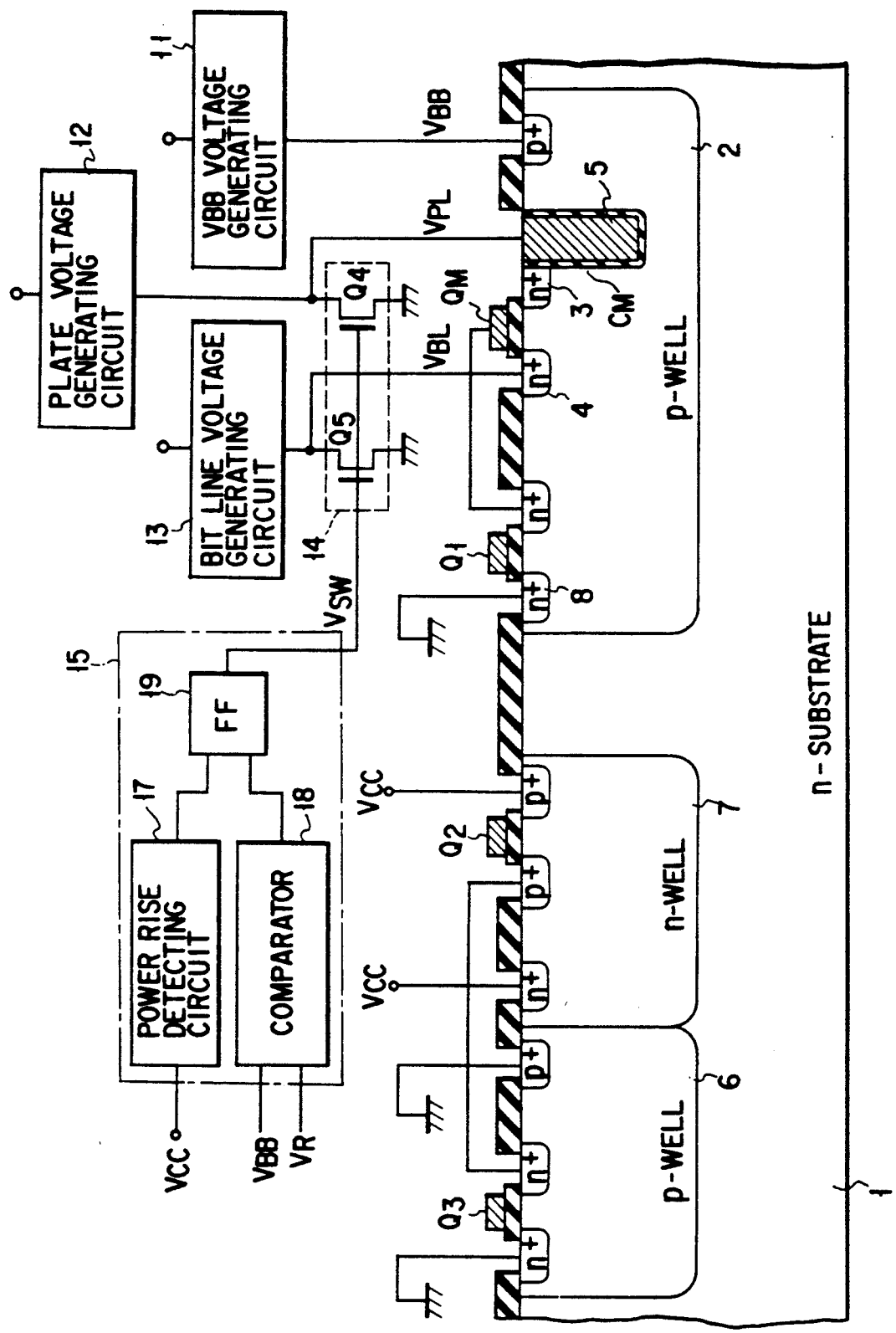
FIG. 1 is a view showing the major portion of a CMOS-DRAM according to the first embodiment of the present invention.
Figure 13:
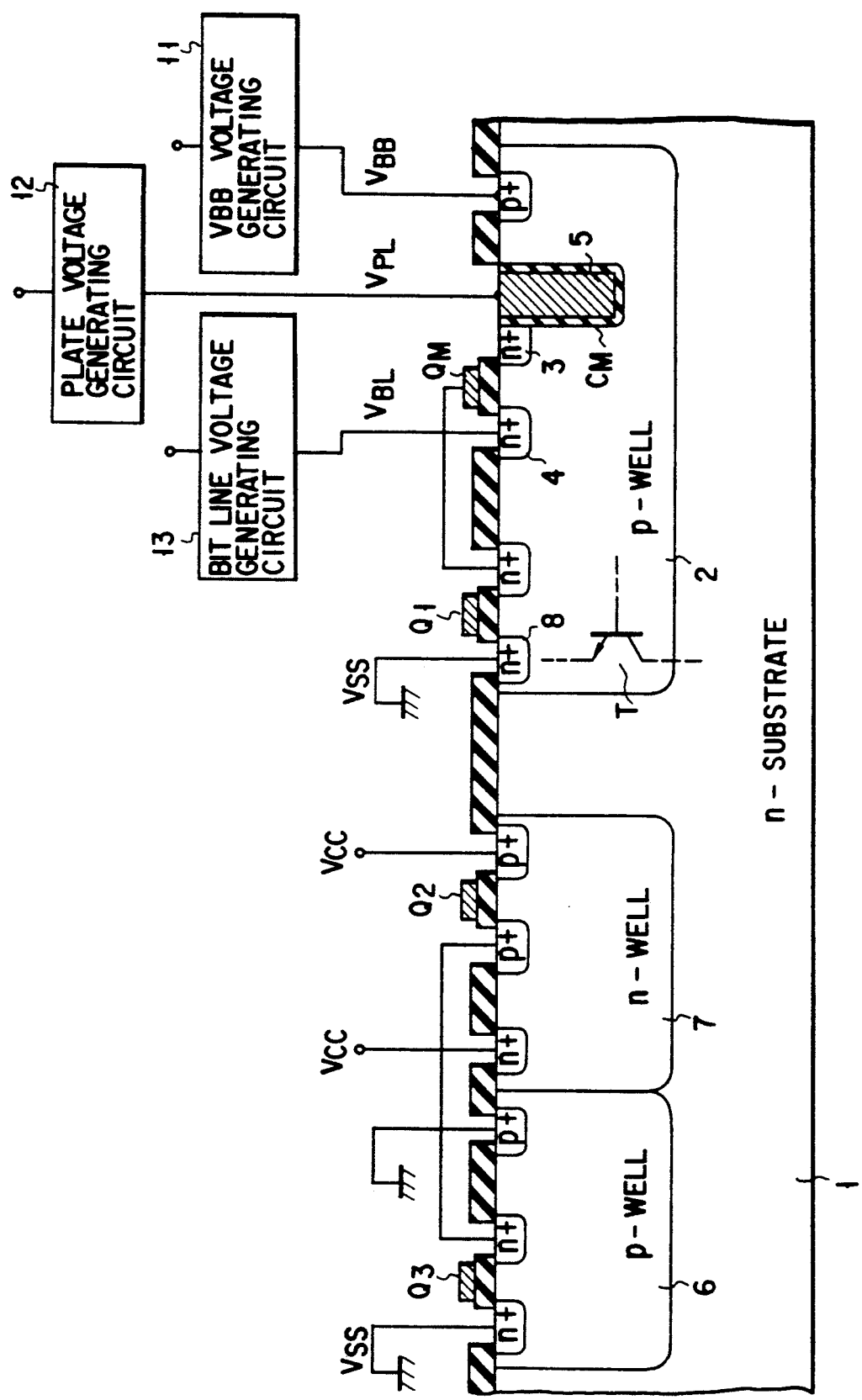
FIG. 13 is a view showing the major portion of a conventional CMOS-DRAM.

FIG. 1 is a sectional view showing the major portion of a CMOS-DRAM according to the first embodiment of the present invention. In FIG. 1, the same reference symbols as in FIG. 13 are used to denote the corresponding or similar portions, and a detailed description of such portions will be omitted. In the first embodiment, a selective grounding circuit 14 is provided, which is made up of an NMOS transistor Q4 for selectively grounding the plate electrode 5 of a DRAM cell, and an NMOS transistor Q5 for selectively grounding a bit line. The selective grounding circuit 14 is controlled by a control circuit 15 which starts operating upon detection of a rise in the power supply.

As is shown in FIG. 1, the control circuit 15 comprises: a power rise detecting circuit 17 for detecting a rise in the power supply; a comparator 18 for comparing the output voltage $V_{BB}$ of a $V_{BB}$ voltage generating circuit 11 with a reference voltage $V_R$; and a flip-flop 19 which is set or reset in response to the outputs of the power rise detecting circuit 17 and comparator 18.

The selective grounding circuit 14, the control circuit 15, the $V_{BB}$ voltage generating circuit 11, the plate voltage generating circuit 12, the bit line voltage generating circuit 13 are formed in that portion of the n-type substrate which is in the vicinity of the p-type well 2. Alternatively, they may be formed in a p-type well which is formed in the substrate independently of the p-type well 2.

The p-type well 6 of a peripheral circuit portion is grounded, and the n-type well 7 thereof is applied with a power supply voltage. This means that the p-type well of the core circuit portion, the p-type well of the peripheral circuit portion, and the n-type well of the peripheral circuit portion are applied with different well voltages. Thus, channel ion implantation is carried out such that the respective MOS transistors can have threshold values corresponding to the respective well voltages.

FIG. 2 shows a specific structure of the DRAM cell portion. Referring to FIG. 2, a trench is formed in the p-type well 2. An n-type diffusion layer 23, which serves as a capacitor electrode, is formed on the wall of the trench, and a capacitor insulating film 24 is formed on the surface of the n-type diffusion layer 23. A plate electrode 5 made of polycrystalline silicon is formed in the trench in such a manner as to fill the trench. The n-type diffusion layer 23, the capacitor insulating film 24 and the plate electrode 5 jointly constitute a capacitor CM. The plate electrode 5 extends onto a field insulating film 26, as is shown in FIG. 2, and is formed as a pattern together with the plate electrodes of other memory cells.

Adjacent to the trench, a gate electrode 22 is formed on the p-type well 2 of the substrate 1, with a gate insulating film 21 interposed. N-type diffusion layers 3 and 4, which serve as a source and a drain, respectively, are formed on the respective sides of the gate electrode 22. The gate electrode 22 and the n-type diffusion layers 3 and 4 jointly constitute an NMOS transistor QM serving as a transfer gate. The gate electrode 22 extends in the direction perpendicular to the drawing sheet of FIG. 2, and is used as a word line. A transit word line 28, which is formed simultaneously with the gate electrode 22, is arranged on the plate electrode 5, with an interlayer insulation film 27 interposed.

The DRAM cell composed of the capacitor CM and the NMOS transistor QM is covered with an interlevel insulation film 29. A contact hole is formed in the interlevel insulation film 29, and a bit line 30 to be connected to the n-type diffusion layer 4 is formed in the contact hole by use of molybdenum silicide ($MoSi_2$).

The DRAM of the first embodiment operates as follows. Substantially simultaneously with the time at which the power supply is turned on, the control circuit 15 produces an "H"-level output. When the power rise detecting circuit 17 detects the power rize, the flip-flop 19 is set by the output and produces an "H"-level signal. Due to this "H"-level signal of the flip-flop 19, the NMOS transistors Q4 and Q5 of the grounding circuit 14 are turned on, thereby forcibly grounding the plate electrode 5 and the bit line. Further, the "H"-level output of the grounding circuit 14 causes the outputs of the plate voltage generating circuit 12 and the bit line voltage generating circuit 13 to be set in a floated or suspended state.

When the voltage applied to the p-type well 2 decreases due to the voltage generated by the $V_{BB}$ voltage generating circuit 11, the comparator 18 of the control circuit 15 starts operating, the flip-flop 19 is reset, the NMOS transistors Q4 and Q5 of the grounding circuit 14 are turned off, and the plate voltage and the bit line voltage are applied by the plate voltage generating circuit 12 and the bit line voltage generating circuit 13, respectively.

In the first embodiment, the plate electrode and the bit line are grounded, as mentioned above. When the power supply is turned on, therefore, a voltage increase in the p-type well due to the capacitive coupling to the substrate is suppressed, thereby preventing the parasitic bipolar transistor from being turned on.

The operation of the first embodiment will be explained in detail with reference to FIGS. 3 and 4.

FIG. 3 shows the state of the capacitive coupling between the structural elements of the CMOS-DRAM just after the power supply is turned on. Since, in the DRAM cell array, the electric potentials at a large number of the bit lines vary in similar manners, the bit lines are shown as an unit in FIG. 3. Similarly, the word lines and the storage nodes (memory nodes) are shown as respective units in FIG. 3. As is apparent from FIG. 3, the capacitive coupling between the structural elements is very complex. Therefore, the diagram shown in FIG. 3 can be further simplified, with the following points taken into consideration:

(a) Capacitance C7 exists between the storage node and the plate electrode, capacitance C8 exists between the storage node and the p-type well, and capacitance C9 exists between the storage node and the word line. Of these three capacitances, capacitance C9 between the storage node and the word line is far smaller than the other two capacitances C7 and C8. Hence, where capacitance C9 can be ignored, capacitances C7 and C8 can be collectively represented as one capacitance between the plate electrode and the p-type well.

(b) Also, capacitance C5 between the plate electrode and the bit line is far smaller than the other capacitances. This is because the plate electrode and the bit line are shielded from each other by the transit word line 28 located therebetween, as is apparent from FIG. 2. Accordingly, capacitance C5 can be ignored as well.

(c) There is a certain delay time between the time at which the power supply is turned on and the time at which the voltage generating circuits 11, 12 and 13 start operating. In particular, where the power supply rises in a very short time of about several μsec, the p-type well, the plate electrode and the bit line are kept in a substantially floated condition until the end of the rise in the power supply. Further, the threshold value of the NMOS transistor Q1, with which the word line is grounded when non-selected, is very small in the state where the p-type well is not applied with voltage $V_{BB}$. The threshold value of the NMOS transistor Q1 is very small whether the NMOS transistor Q1 is of a depletion type or an enhancement type. Accordingly, the word line can be regarded as being grounded from the time immediately after the power supply is turned on.

With the above points being taken into consideration, the capacitive coupling state shown in FIG. 3 can be further simplified in the manner depicted in FIG. 4. Referring to FIG. 4, if the plate electrode and the bit line are regarded as being in a floated condition, capacitance C11 between the p-type well and the word line can be expressed as follows:

$$C11 = C2 + C6 \cdot C10/(C6+C10) + C3 \cdot C4/(C3+C4) \ldots \quad (1)$$

If the p-type well is regarded as being in the floated condition, the voltage VP at the p-type well at the time of application of the power supply voltage $V_{CC}$ can be represented as follows:

$$VP = V_{CC} C1/(C1+C11) \ldots \quad (2)$$

In the case of a 16-Mbit DRAM made on the basis of a design rule of 0.6 μm, capacitance C11 between the p-type well and the word line is approximately three times as large as capacitance C1 between the p-type well and the n-type substrate. According to the conventional technique wherein neither the plate electrode nor the bit line is grounded when the power supply is turned on, the voltage VP at the p-type well increases up to 1.5 V in the case where $V_{CC}=6$ V, as is understood from formula (2) above. Accordingly, the parasitic bipolar transistor T explained with reference to FIG. 13 is turned on.

In contrast, according to the first embodiment of the present invention, the plate electrode and the bit line are selectively grounded when the power supply is turned on. Hence, capacitance C12 (=C2+C3+C10) between the p-type well and the ground potential is far larger than the capacitance C11 represented by formula (1). In the case of a 16-Mbit DRAM made on the basis of a design rule of 0.6 μm, capacitance C12 is approximately four times as large as capacitance C11, and is therefore twelve times as large as capacitance C1. Hence, the voltage VP at the p-type well is represented by formula (3) below where $V_{CC}=6$ V.

$$VP = V_{CC} C1/(C1+C12) = 0.5 [V] \ldots \quad (3)$$

Accordingly, the parasitic bipolar transistor is not turned on.

When a predetermined time has elapsed after the power supply is turned on, the p-type well is applied with the bias voltage $V_{BB}$ generated by the $V_{BB}$ voltage generating circuit 11. When the p-type well bias reaches the predetermined value, the grounding circuit 14 is turned off.

FIGS. 5A and 5B are graphs showing how the voltage VP at the p-type well 2 in the DRAM cell array region and the penetration current in the DRAM cell array region vary in the period immediately after the power supply is turned on. The present invention and the conventional technique are compared with each other in FIGS. 5A and 5B. As is understood from FIGS. 5A and 5B, the plate electrode and the bit line are forcibly grounded during a predetermined period after the power supply is turned on, with the result that a voltage increase which is due to the capacitive coupling of the p-type well 2 containing the DRAM cell array is suppressed. Accordingly, the parasitic bipolar transistor is prevented from being turned on, and the amount of penetration current which may flow can be reduced considerably.

The first embodiment of the present invention is advantageous even where the p-type well 2 of the DRAM cell array does not have a grounded n-type diffusion layer. To be specific, since the voltage increase at the p-type well is suppressed, the period between the time at which the $V_{BB}$ voltage generating circuit starts operating and the time at which the p-type well 2 is applied with the predetermined bias voltage $V_{BB}$ is shortened. Accordingly, the time required for the DRAM chip to start a normal operation can be shortened.

In the first embodiment, the plate electrode and the bit line are selectively grounded when the power supply is turned on. However, sufficient advantages are achieved even if a selective grounding circuit is provided only for the plate electrode.

FIG. 6 shows the major portion of a CMOS-DRAM according to the second embodiment of the present invention. The CMOS-DRAM of the second embodiment employs a clamp circuit 16, in place of the selective grounding circuit 14 of the first embodiment. The clamp circuit 16 determines the upper limit of the well voltage applied to the p-type well where the DRAM cell array is formed. Like the $V_{BB}$ generating circuit 11, the clamp circuit 16 is formed at that position of the n-type substrate which is other than the p-type well 2.

Figure 7A:
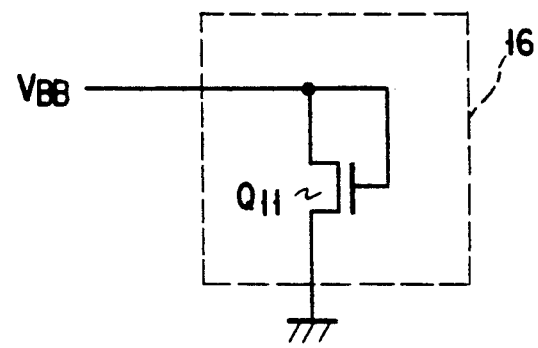
FIGS. 7A to 7C show examples of a clamp circuit employed in the second embodiment.
Figure 7B:
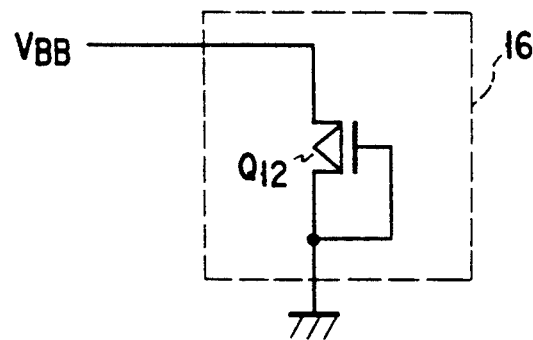
Figure 7C:
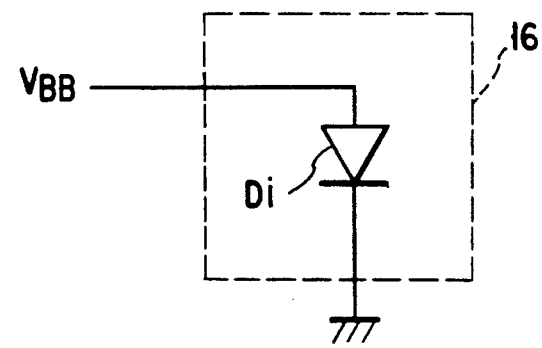

FIGS. 7A to 7C show specific structures of the clamp circuit 16. In FIG. 7A, the clamp circuit 16 is made by an NMOS transistor Q11 having its source grounded and having its gate and drain connected in common to a $V_{BB}$ point (an NMOS diode). In FIG. 7B, the clamp circuit 16 is made by a PMOS transistor Q12 having its gate and drain grounded and having its source connected to the $V_{BB}$ point (a PMOS diode). In FIG. 7C, the clamp circuit 16 is made by a pn junction diode Di.

FIGS. 8 to 10 show how the clamp circuits 16 shown in FIGS. 7A to 7C are obtained, respectively.

Referring to FIG. 8, the NMOS transistor Q11 is formed in a p-type well 31 which is provided in the n-type silicon substrate 1 independently of the DRAM cell region, whereby the clamp circuit shown in FIG. 7A is obtained. The p-type well 31 is connected to the $V_{BB}$ point, together with the gate and drain of the NMOS transistor Q11. Referring to FIG. 9, the PMOS transistor Q12 is formed in an n-type well 32 formed in the n-type silicon substrate 1, whereby the clamp circuit shown in FIG. 7B is obtained. Referring to FIG. 10, a p-type layer 34 and an n-type layer 35 are formed by diffusion in an n-type well 33 which is provided in the n-type silicon substrate 1, and the pn junction diode Di obtained thereby constitutes the clamp circuit shown in FIG. 7C.

In the second embodiment as well, the voltage increase at the p-type well 2 can be suppressed when the external power supply is turned on, as long as the current driving capacity of the clamp circuit 16 is more than a predetermined level. In the first embodiment, the voltage increase at the p-type substrate 2 is suppressed by reducing the effects which the capacitive coupling between the n-type substrate 1 and the p-type well 2 may have on the voltage increase. In the second embodiment, in contrast, the voltage at the p-type well (which voltage is likely to increase due to the capacitive coupling) is clamped, so as to prevent the parasitic bipolar transistor from being turned on. When the $V_{BB}$ voltage generating circuit 11 starts operating and the voltage output therefrom becomes lower than a given value, the clamp circuit 16 is turned off, and the voltage at the p-type well 2 is set to be a negative design value $V_{BB}$.

In the case where no parasitic bipolar transistor exists, the time required for stabilizing the voltage at the p-type well 2 is shortened in the second embodiment as well as in the first embodiment.

The first and second embodiments mentioned above are embodiments wherein an n-type silicon substrate is employed. However, the present invention is also applicable to a case where a p-type silicon substrate is employed and a CMOS-DRAM is provided by forming a triple well structure in the p-type substrate, as will be explained below.

FIG. 11 shows an embodiment wherein a structure similar to that of the first embodiment shown in FIG. 1 is obtained by a triple well structure. In the embodiment shown in FIG. 11, a p-type silicon substrate 41, which has an opposite conductivity to that of the substrate of the first embodiment, is employed. An n-type well 42 containing a DRAM cell array region is formed in the p-type silicon substrate 41, and a p-type well 2 is formed in the n-type well 42 Except for this triple well structure, the embodiment shown in FIG. 11 is similar to the first embodiment. As is understood from the embodiment shown in FIG. 11, the n-type region that surrounds the p-type well need not be the substrate itself; it may be a well having the opposite conductivity to that of the substrate. In this case as well, the advantages of the present invention are not adversely affected.

FIG. 12 shows an embodiment wherein the embodiment shown in FIG. 6 is attained by use of a p-type silicon substrate 41.

In the first embodiment shown in FIG. 1, the control circuit 15 is made up of a power rise detecting circuit 17, a comparator 18, and a flip-flop 19. However, a timer circuit may be employed, replacing such a control circuit. Where the timer circuit is employed, the selective grounding circuit 14 may be kept in an ON state for a predetermined period of time after detection of a rise in the power supply voltage.

In the above descriptions, reference was made only to a CMOS-DRAM. However, the present invention is applicable also to integrated circuits of various types as long as the integrated circuits have a well structure similar to the well structures mentioned above and well voltages are controlled in a similar manner to that mentioned above.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A DRAM comprising:
   a semiconductor substrate;
   a first region of a first conductivity type formed in the substrate;
   a well of a second conductivity type, surrounded by the first region;
   a capacitor formed in the well and having an plate electrode which is in capacitive coupling to the well;
   a transfer MOS transistor serving as transfer gate means and formed in the well, said transfer MOS having a source/drain terminal connected to the capacitor;
   a bit line connected to another source/drain terminal of the transfer MOS transistor;
   a word line connected to a gate of the transfer MOS transistor;
   means for applying a first potential to the first region;
   means for applying a well potential to the well; and
   grounding means for temporarily grounding at least one of the plate electrode and the bit line when application of the first potential is started.

2. The DRAM according to claim 1, wherein said grounding means includes a MOS transistor formed in the substrate and having a source/drain terminal connected to the plate electrode, another source/drain terminal which is grounded, and a gate which is selectively applied with a potential to ground the plate electrode.

3. The DRAM according to claim 1, wherein said grounding means includes a MOS transistor formed in the substrate and having a source/drain terminal connected to the bit line, another source/drain terminal which is grounded, and a gate which is selectively applied with a potential to ground the bit line.

4. The DRAM according to claim 1, wherein said grounding means temporarily grounds both of the plate electrode and the bit line when application of the first potential is started.

5. The DRAM according to claim 1, wherein said plate electrode is located in a trench formed in the well.

6. The DRAM according to claim 1, further comprising an additional MOS transistor for grounding the word line when it is non-selected, said additional MOS transistor having a source/drain terminal which is grounded and another source/drain terminal connected to the gate of the transfer MOS transistor.

7. The DRAM according to claim 1, wherein said first and second conductivity type are an n-type and a p-type, respectively.

8. The DRAM according to claim 1, wherein said substrate is of the first conductivity type.

9. The DRAM according to claim 1, wherein said substrate is of the second conductivity type.

10. The DRAM according to claim 1, further comprising clamp means, formed in the substrate, for preventing the well from having a potential of a polarity opposite to that of the well potential when application of the first potential is started.

11. The DRAM according to claim 10, wherein said clamp means comprises a MOS transistor formed in the substrate and having a source/drain terminal which is grounded, and a gate and another source/drain terminal both connected to the well.

12. The DRAM according to claim 10, wherein said clamp means comprises an MOS transistor formed in the substrate and having a gate and a source/drain terminal which are grounded, and another source/drain terminal connected to the well.

13. The DRAM according to claim 10, wherein said clamp means comprises a diode formed in the substrate and having a first layer of the first conductivity type which is grounded and a second layer of the second conductivity type connected to the well.

14. A DRAM comprising:
a semiconductor substrate;
a first region of a first conductivity type, formed in the substrate;
a well of a second conductivity type, surrounded by the first region;
a capacitor formed in the well and having an plate electrode which is in capacitive coupling to the well;
a transfer MOS transistor serving a transfer gate means and formed in the well, said MOS transistor having a source/drain terminal connected to the capacitor;
a bit line connected to another source/drain terminal of the transfer MOS transistor;
a word line connected to a gate of the transfer MOS transistor;
means for applying a first potential to the first region;
means for applying a well potential to the well; and
clamp means, formed in the substrate, for preventing the well from having a potential of a polarity opposite to that of the well potential when application of the first potential is started.

15. The DRAM according to claim 14, wherein said first and second conductivity types are n-type and p-type, respectively.

16. The DRAM according to claim 15, wherein said clamp means comprises an NMOS transistor formed in the substrate and having a source/drain terminal which is grounded, and a gate and another source/drain terminal both connected to the well.

17. The DRAM according to claim 15, wherein said clamp means comprises an PMOS transistor formed in the substrate and having a gate and a source/drain terminal which are grounded, and another source/drain terminal connected to the well.

18. The DRAM according to claim 15, wherein said clamp means comprises a diode formed in the substrate and having an n-type layer which is grounded and a p-type layer connected to the well.

19. The DRAM according to claim 15, further comprising an additional MOS transistor for grounding the word line when it is non-selected, said additional MOS transistor having a source/drain terminal which is grounded and another source/drain terminal connected to the gate of the transfer MOS transistor.

* * * * *